(12) United States Patent
Gauthier, Jr. et al.

(10) Patent No.: US 8,614,121 B2
(45) Date of Patent: Dec. 24, 2013

(54) METHOD OF MANUFACTURING BACK GATE TRIGGERED SILICON CONTROLLED RECTIFIERS

(75) Inventors: Robert J. Gauthier, Jr., Hinesburg, VT (US); Junjun Li, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 13/306,488

(22) Filed: Nov. 29, 2011

(65) Prior Publication Data

US 2013/0134477 A1    May 30, 2013

(51) Int. Cl.
*H01L 21/00*    (2006.01)

(52) U.S. Cl.
USPC .... 438/157; 438/257; 438/593; 438/E29.283; 257/345; 257/347; 257/365; 257/627

(58) Field of Classification Search
USPC ............ 257/64–69, 345, 347–348, 365, 257/410–413, E29.286; 438/157, 257–258, 438/593, 458
See application file for complete search history.

(56) References Cited

U.S. PATENT DOCUMENTS

| | | | |
|---|---|---|---|
| 4,027,216 A | 5/1977 | Rozek | |
| 6,074,899 A | 6/2000 | Voldman | |
| 6,096,584 A | 8/2000 | Ellis-Monaghan et al. | |
| 6,373,682 B1 | 4/2002 | Goodwin-Johansson | |
| 6,909,149 B2 | 6/2005 | Russ et al. | |
| 6,913,964 B2 * | 7/2005 | Hsu | 438/239 |
| 7,102,166 B1 * | 9/2006 | Bryant et al. | 257/64 |
| 7,399,665 B2 | 7/2008 | Gauthier, Jr. et al. | |
| 7,804,138 B2 | 9/2010 | Morris | |
| 7,923,266 B2 | 4/2011 | Thijs et al. | |
| 8,431,994 B2 * | 4/2013 | Chan et al. | 257/345 |
| 2005/0212051 A1 | 9/2005 | Jozwiak et al. | |
| 2006/0249759 A1 | 11/2006 | Morris | |
| 2008/0073725 A1 | 3/2008 | Morris | |
| 2008/0142899 A1 | 6/2008 | Morris | |
| 2010/0267212 A1 | 10/2010 | Morris | |
| 2010/0328826 A1 | 12/2010 | Salman et al. | |

OTHER PUBLICATIONS

O. Thomas et al. "32nm and beyond Multi-Vt Ultra-Thin Body and BOX FDSOI: From Device to Circuit", IEEE 2010, pp. 1703-1706.
Q. Liu et al. "Ultra-Thin-Body and BOX (UTBB) Fully Depleted (FD) Device Integration for 22nm Node and Beyond", Symposium on VLSI Technology Digest of Technical Papers, IEEE 2010, pp. 61-62.

* cited by examiner

*Primary Examiner* — Dung A. Le
(74) *Attorney, Agent, or Firm* — Anthony J. Canale; Roberts Mlotkowski Safran & Cole, P.C.

(57) ABSTRACT

Back gate triggered silicon controlled rectifiers (SCR) and methods of manufacture are disclosed. The method includes forming a first diffusion type and a second diffusion type in a semiconductor layer of a silicon on insulator (SOI) substrate. The method further includes forming a back gate of a first diffusion type in a substrate under an insulator layer of the SOI substrate. The method further includes forming raised diffusion regions of a first dopant type and a second dopant type, adjacent to the second diffusion type and the first diffusion type, respectively. The back gate is formed to cover the second diffusion type, the first diffusion type and the second dopant type of the raised diffusion regions.

13 Claims, 7 Drawing Sheets

METHOD OF MANUFACTURING BACK GATE TRIGGERED SILICON CONTROLLED RECTIFIERS

FIELD OF THE INVENTION

The invention relates to semiconductor structures and, more particularly, to back gate triggered silicon controlled rectifiers (SCR) and methods of manufacture.

BACKGROUND

Electrostatic discharge is a serious issue in integrated circuits (ICs). For example, integrated circuits made from semiconductor materials such as silicon (Si) and insulating materials such as $SiO_2$ can suffer permanent damage when subjected to high voltages such as electrostatic discharged events. Also, ESD susceptibility has become an ever increasing issue as process technology allows ever smaller scaling of the integrated circuits. That is, smaller integrated circuits become even more susceptible to ESD events due to its smaller fabrication geometry.

Traditional methods of shunting ESD to protect ICs involves devices such as diodes. These diodes include, for example, zener diodes, transient voltage suppression (TVS) diodes, and complementary metal oxide semiconductor (CMOS) or bipolar clamp diodes. However, the parasitic impedance of such protection devices can distort and deteriorate signal integrity, and also is known to exhibit high capacitance. However, high frequency circuit applications require low-capacitance ESD protection. Also, the use of diodes are known to consume large amounts of area, which are at a premium in the smaller technology nodes.

Accordingly, there exists a need in the art to overcome the deficiencies and limitations described hereinabove.

SUMMARY

In an aspect of the invention, a method comprises forming a first diffusion type and a second diffusion type in a semiconductor layer of a silicon on insulator (SOI) substrate. The method further comprises forming a back gate of a first diffusion type in a substrate under an insulator layer of the SOI substrate. The method further comprises forming diffusion regions of a first dopant type and a second dopant type, adjacent to the second diffusion type and the first diffusion type, respectively. The back gate is formed to cover the second diffusion type, the first diffusion type and the second dopant type of the diffusion regions.

In another aspect of the invention, a method comprises forming an N-well in a semiconductor layer of a silicon on insulator (SOI) substrate. The method further comprises forming a P-well in the semiconductor layer of the SOI substrate. The method further comprises forming an N+ gate under the SOI substrate and a BOX layer. The method further comprises forming a raised P+ anode, adjacent to the N-well. The method further comprises forming a raised N+ cathode, adjacent to the P-well.

In an additional aspect of the invention, a silicon controlled rectifier (SCR) structure comprises a raised P+ anode and a raised N+ cathode. The structure further comprises an N-well formed in a semiconductor layer of a silicon on insulator (SOI) substrate, and adjacent to the raised P+ anode. The structure further comprises a P-well formed in the semiconductor layer of the SOI substrate, and adjacent to the raised N+ cathode. The structure further comprises an N+ gate formed under the SOI substrate, under a BOX layer. The N+ gate is biased during an ESD event to turn on a FET between the N-well and the N+ cathode, so as to trigger the SCR structure.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a back gate silicon controlled rectifier (SCR), which comprises the structures of the present invention. In still further embodiments, a method in a computer-aided design system is provided for generating a functional design model of the a back gate silicon controlled rectifier (SCR).

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

The invention relates to semiconductor structures and, more particularly, to back gate triggered silicon controlled rectifiers (SCR) and methods of manufacture. More specifically, the present invention is directed to back gate triggered SCRs compatible with ultra-thin box and body (UTBB) technology. In embodiments, the SCRs of the present invention can be provided as a single or dual gate triggered SCR structure in a single BOX or double BOX structure. Accordingly, as discussed in more detail below, the present invention contemplates many different SCR structures compatible with UTBB technologies, all of which provide advantages over conventional diode structures.

Advantageously, the SCR structures of the present invention provide an improved electrostatic discharge (ESD) structure, providing both low capacitance and high ESD performance. For example, the present invention provides a low capacitance ESD solution for a signal pin. Also, advantageously, the SCR structures of the present invention provide a small area ESD solution for a power pin. More specifically, the present invention eliminates the need for external trigger diodes by using, e.g., parasitic NFET for triggering. The present invention thus provides a considerable improvement in area management, as external trigger diodes can consume 30%-50% of the total ESD diode triggered SCR (DTSCR) area.

Figure 1:
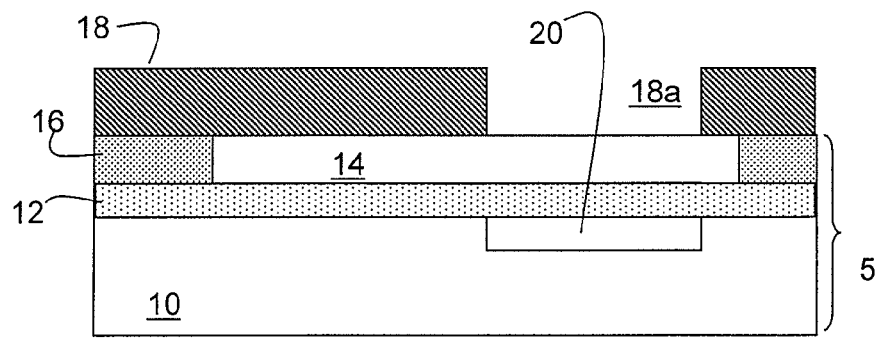
FIGS. 1-5 show structures and respective processing steps in accordance with aspects of the present invention.

FIG. 1 shows a structure and respective processing steps in accordance with the present invention. More specifically, FIG. 1 shows an SOI substrate 5 comprising a wafer 10, e.g., semiconductor material. The semiconductor material can be, for example, Si, SiC, SiGe, SiGeC, Ge, GaAs, InAs, InP, as well as other III/V or II/VI compound semiconductors or any combination thereof. In embodiments, the wafer 10 is a p-substrate. A buried insulator layer 12 is formed on the wafer 10. In embodiments, the buried insulator layer 12 is an ultra thin buried oxide layer (BOX). For example, the ultra thin BOX can have a thickness of about 100 nm to about 1 micron. A semiconductor material 14 is formed on the BOX 12. In embodiments, the semiconductor material 14 is a P-substrate semiconductor material. As should be understood by those of skill in the art, the SOI substrate 5 can be formed in any conventional manner such as, for example, SiMOX or other bonding techniques.

Still referring to FIG. 1, shallow trench isolation (STI) structures 16 can be formed in the semiconductor material 14, using conventional lithographic, etching and deposition processes. For example, a resist can be formed on the semiconductor material 14, which is exposed to energy to form a pattern (openings). An etching process, e.g., reactive ion etching (RIE), is then performed through the patterns to form trenches within the semiconductor material 14. An oxide or other insulating material is then deposited within the trenches using, for example, a conventional deposition process, e.g., chemical vapor deposition (CVD). Any residual oxide or other insulating material can be removed from the surface of the semiconductor material 14 by a conventional chemical mechanical polish (CMP).

After formation of the STI structures 16, a resist 18 is then formed on the semiconductor material 14, and exposed to energy to form a pattern 18a (opening). A conventional implant process is then performed through the opening 18a to form an N+ region 20, e.g., back gate, under the P− semiconductor material 14 and BOX 12. In embodiments, the implant process can include, for example, any N− dopant type, e.g., arsenic, at an energy level known to those of skill in the art, e.g., $1E^{19}$. As should be understood by those of skill in the art, the N+ region 20 will form a good ohmic contact. In embodiments, the N+ region 20 can be several tenths of a nm thick, or more.

Figure 2:
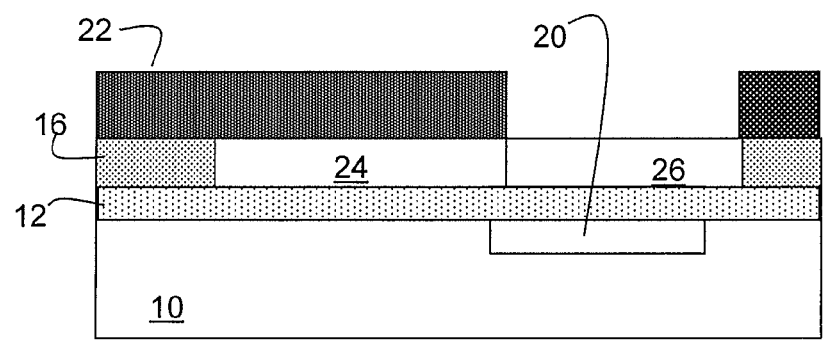

In FIG. 2, the resist is removed using any conventional process. For example, the resist can be removed by an oxygen ashing process. After removal of the resist, N− and P-wells are formed in the semiconductor material 14 using conventional ion implantation processes. For example, using a separate mask for each region, as represented by mask 22, an N− dopant type and P− dopant type will be ion implanted into the semiconductor material 14 to form the N-well 24 and the P-well 26, respectively. In embodiments, for example, the N− dopant can be arsenic and the P− dopant can be boron. In embodiments, the N-well 20 is provided under the P-well 26, with a slight overlap with the N-well 24 (depending on the patterning resolution). The separate masks for each region can be removed using conventional processes, e.g., ashing.

Figure 3:
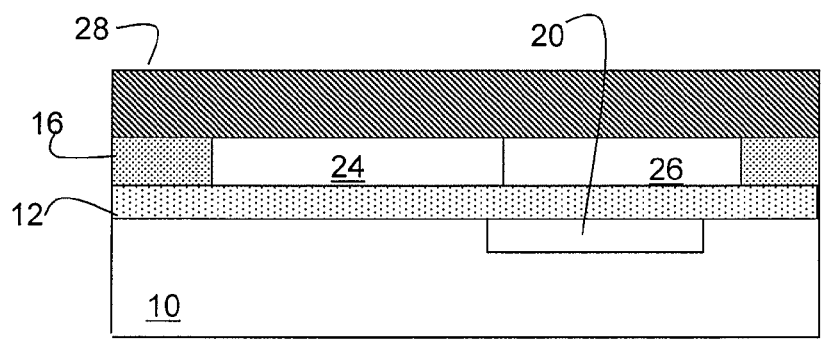

In FIG. 3, a mask material 28 is formed over the semiconductor material 14, and more specifically, over the N-well 24 and the P-well 26, as well as the STI structures 16. In embodiments, the mask material 28 is a nitride, which can be patterned for subsequent use as a mask for self aligned source and drain etching.

Figure 4:
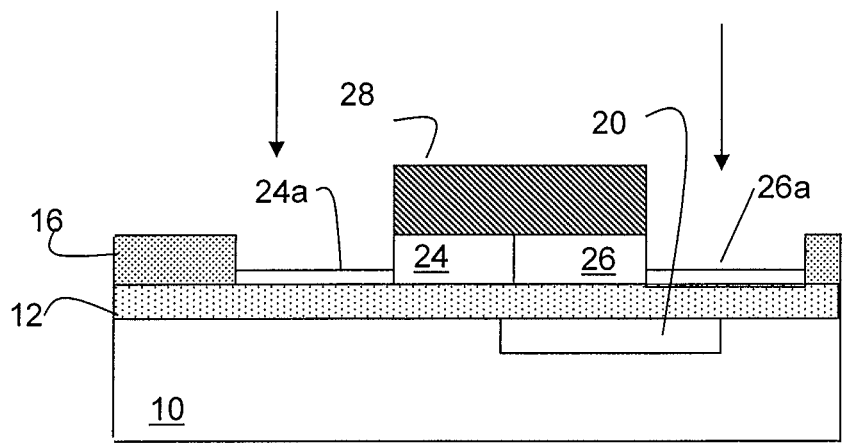

In FIG. 4, the mask material, e.g., nitride 28, is patterned using conventional lithography and etching processes, as described herein. In embodiments, the nitride material 28 provides a self aligned mask for etching source and drain regions. More specifically, after the etching of the nitride material 28, a second etching process to thin the wells to form respective seed layers 24a and 26a, for subsequent formation of the source and drain regions. In optional embodiments, the N-seed layer 24a and the P− seed layer 26a can be doped to form P+ regions and N+ regions, respectively. In this way, additional dopants can be provided in the respective seed layers 24a and 26a, prior to formation of source and drain regions. In embodiments, the source and drain regions can be raised source and drain regions; although, other configurations are also contemplated by the present invention, e.g., the source and drain regions can also be planar as should be understood by those of skill in the art.

Figure 5:
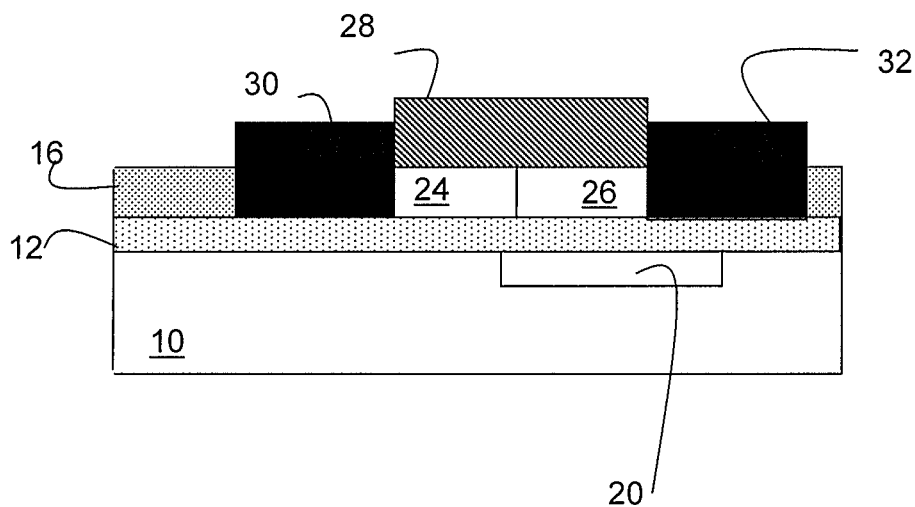

In FIG. 5, raised source and drain regions are formed on the respective seed layers 24a and 26a. More specifically, using separate masking steps, the source region 30 (anode) and drain region 32 (cathode) are formed, using the seed layers 24a and 26a, respectively. Even more specifically, while masking the seed layer 26a, an epitaxial grown Si layer is provided on the seed layer 24a, to form the P+ source region 30. In embodiments, the epitaxial grown Si layer can be an in situ doped P+ material. Alternatively, the epitaxial grown Si layer can be P+ doped after the growth process. Similarly, while masking the P+ source region 30, an epitaxial grown Si layer is provided on the seed layer 26a, to form the N+ drain region 32. In embodiments, the epitaxial grown Si layer can be an in situ doped N+ material. Alternatively, the epitaxial grown Si layer can be N+ doped after the growth process. It should be understood by those of skill in the art that the drain and source regions can be formed in any order, using conventional dopant types at conventional concentrations and energy levels.

As should thus be understood, the structure of FIG. 5 forms a P+/N−/P−N+SOI device structure, where the N-well 24 and P-well 26 are defined by a nitride mask 28. The P+/N−/P−/N+ structure forms an SCR device, composed of a PNP and a NPN bipolar device. The N+ region 20, under the BOX 12, acts as a back gate, which covers the entire P-well 26, and partially covers the N+ region 32 and the N-well 24. The N−/P−/N+ form a parasitic NFET device. It should be understood by those of skill in the art that the coverage of the back gate can be within certain tolerance levels, such that the use of terms "completely" and/or "entire" or any derivations thereof, can mean a partial or complete coverage within certain tolerances of several tens of nanometers. Under normal circuit conditions, the back gate is biased at low to turn off the parasitic NFET. Under ESD conditions, the back gate (e.g. N+ region 20) is transiently biased to high to turn on the parasitic NFET, so as to form a current path through the P+/N− diode, and the parasitic NFET device, turning on the SCR device.

Figure 6:
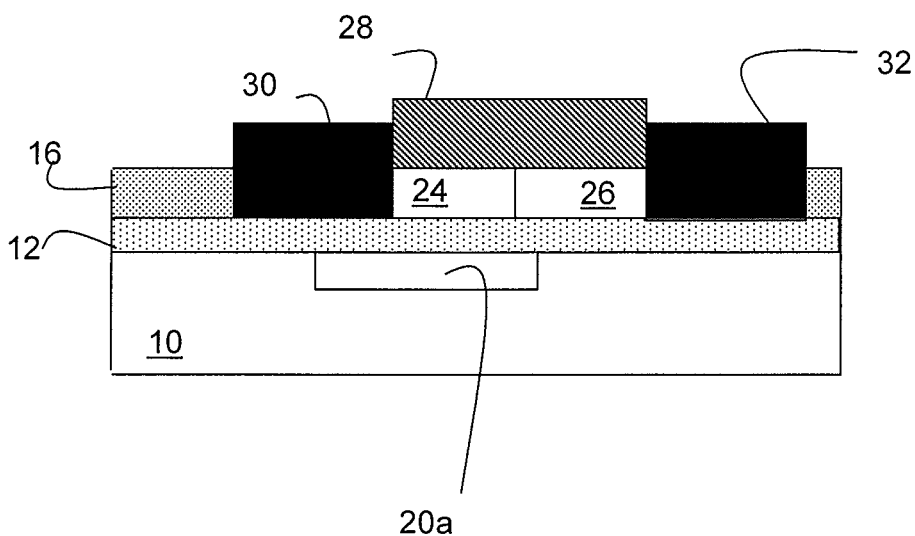
FIG. 6 shows an alternative structure and respective processing steps in accordance with aspects of the present invention.

FIG. 6 shows an alternative structure and respective processing steps in accordance with aspects of the present invention. In the structure of FIG. 6, the back gate is a P+ region 20a, formed in the p-substrate 10. As shown in FIG. 6, the P+ region 20a covers the entire N-well 24, and partially covers the P+ region 30 and the P-well 26. In this way, the structure of FIG. 6 forms a PNP structure. The processing steps to form the structure of FIG. 6 are similar to the processing steps of FIGS. 1-5, with the exception of the formation and placement of the P+ region 20a, under the BOX 12. That is, the P+ region 20a will be formed by a P+ dopant type, through a pattern formed in a resist, which is aligned with the N-well 24.

Figure 7:
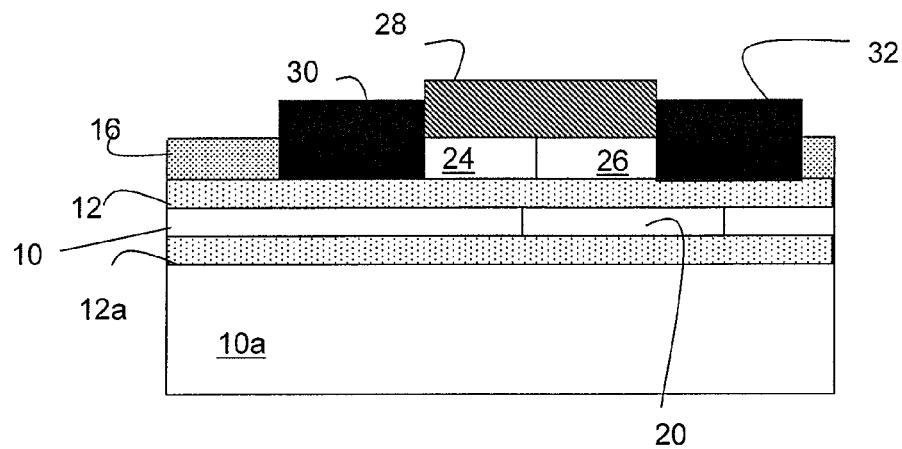
FIG. 7 shows an alternative structure using a double BOX structure and respective processing steps in accordance with aspects of the present invention.

FIG. 7 shows an alternative structure using a double BOX structure and respective processing steps in accordance with aspects of the present invention. More specifically, the structure of FIG. 7 comprises the structure of FIG. 5 with an additional BOX and wafer layer. More specifically, after the formation of the structure of FIG. 5, the wafer 10 can be thinned by conventional mechanical grinding. The grinding will preferably stop at the N+ region 20. Thereafter, the thinned wafer 10' is bonded to a BOX 12a. As shown in FIG. 7, the BOX 12 is also formed on a wafer 10a. In embodiments, the wafer 10a can have similar material properties to the thinned wafer 10', and can be bonded to the BOX 12a using any conventional bonding technique. In an alternative manner of processing, after the thinning of the wafer 10', the N+ region 20 can be formed from an underside of the wafer.

Figure 8:
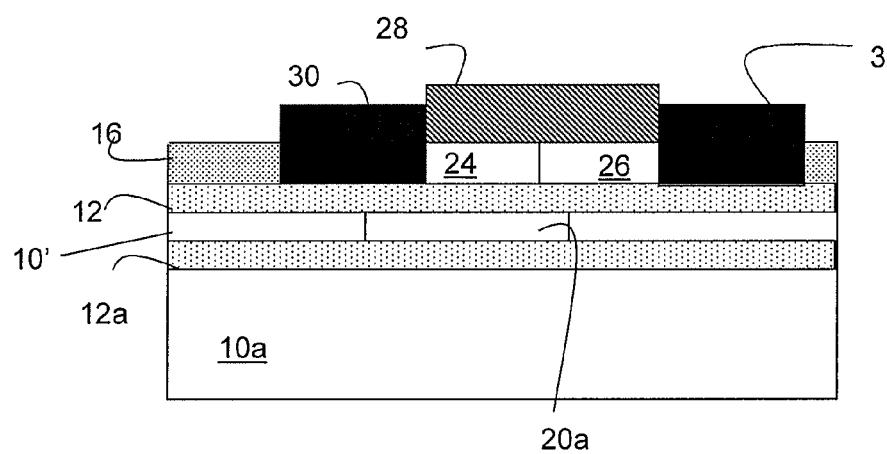
FIG. 8 shows an alternative structure using a double BOX structure and respective processing steps in accordance with aspects of the present invention.

FIG. 8 shows an alternative structure using a double BOX structure and respective processing steps in accordance with aspects of the present invention. More specifically, the structure of FIG. 8 comprises the structure of FIG. 6 with an additional BOX and wafer layer. More specifically, after the formation of the structure of FIG. 6, the wafer 10 can be thinned by conventional mechanical grinding. The grinding will preferably stop at the P+ region 20a. Thereafter, the thinned wafer 10' is bonded to a BOX 12a. As shown in FIG. 8, the BOX 12a is also bonded to a wafer 10a. In embodiments, the wafer 10a can have similar material properties to the thinned wafer 10', and can be bonded to the BOX 12a using any conventional bonding technique. In an alternative manner of processing, after the thinning of the wafer 10', the P+ region 20a can be formed from an underside of the wafer.

Figure 9:
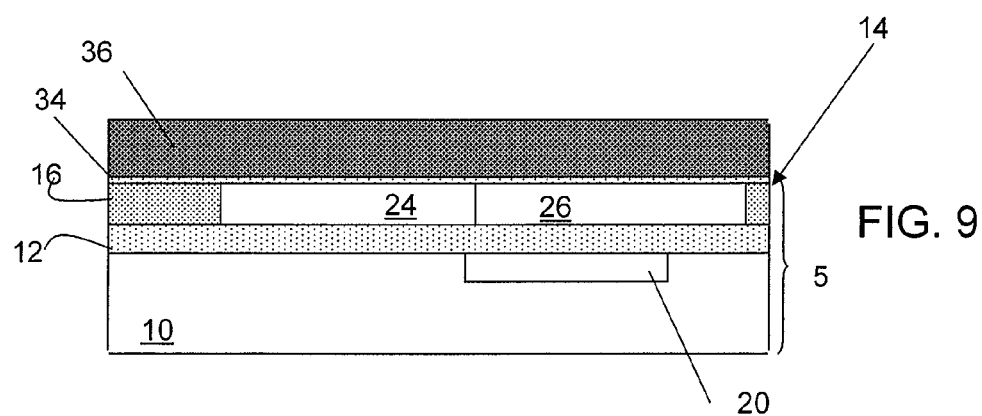
FIGS. 9-12 show processing steps for forming a dual gate triggered structure with respective structures in accordance with aspects of the present invention.

FIGS. 9-12 show processing steps for forming a dual gate triggered structure with respective structures in accordance with aspects of the present invention. More specifically, FIG. 9 shows an SOI substrate 5 comprising a wafer 10, e.g., semiconductor material. The semiconductor material can be, for example, Si, SiC, SiGe, SiGeC, Ge, GaAs, InAs, InP, as well as other III/V or II/VI compound semiconductors or any combination thereof. In embodiments, the wafer 10 is a p-substrate. A buried insulator layer 12 is formed on the wafer 10, which can be an ultra thin buried oxide layer (BOX). For example, the ultra thin BOX 12 can have a thickness of about 100 nm to about 1 micron. A semiconductor material 14 is formed on the BOX 12. In embodiments, the semiconductor material 14 is a P− substrate semiconductor material.

Still referring to FIG. 9, shallow trench isolation (STI) structures 16 can be formed in the semiconductor material 14, using conventional lithographic, etching and deposition processes as previously described herein. After formation of the STI structures 16, a resist is formed on the semiconductor material 14, and exposed to energy to form a pattern (opening). A conventional implant process is then performed through the opening to form an N+ region 20, e.g., back gate, under the P− semiconductor material 14 and BOX 12 (as described above). In embodiments, the implant process can include, for example, any N− dopant type, e.g., arsenic, at an energy level known to those of skill in the art, e.g., $1E^{19}$. In embodiments, the N+ region 20 can be several tenths of a nm thick, or more.

In FIG. 9, N- and P-wells are formed in the semiconductor material 14 using conventional ion implantation processes. For example, using a separate mask for each region, as described above, an N− dopant type and P− dopant type will be ion implanted into the semiconductor material 14 to form the N-well 24 and the P-well 26, respectively. In embodiments, for example, the N− dopant can be arsenic and the P− dopant can be boron. In embodiments, the N-well 20 is provided under the P-well 26, with a slight overlap with the N-well 24 (depending on the patterning resolution). The separate masks for each region can be removed using conventional processes, e.g., ashing.

A gate oxide 34 is then formed over the N-well 24 and the P-well 26, as well as the STI structures 16. In embodiments, the gate oxide 34 can be a high-k dielectric (e.g., hafnium oxide), or low-k dielectric (e.g., $SiO_2$), or any combination thereof. A gate material 36, e.g., poly or other work function metals, is then formed on the gate oxide 34. In embodiments, the gate oxide 34 and the gate material 36 can be formed using any conventional deposition process. For example, depending on the design thickness (physical or electrical) of the gate oxide 34, an atomic layer deposition (ALD) or chemical vapor deposition (CVD) process can be used to form the gate oxide 34. A CVD process can also be used to form the gate material 36.

Figure 10:
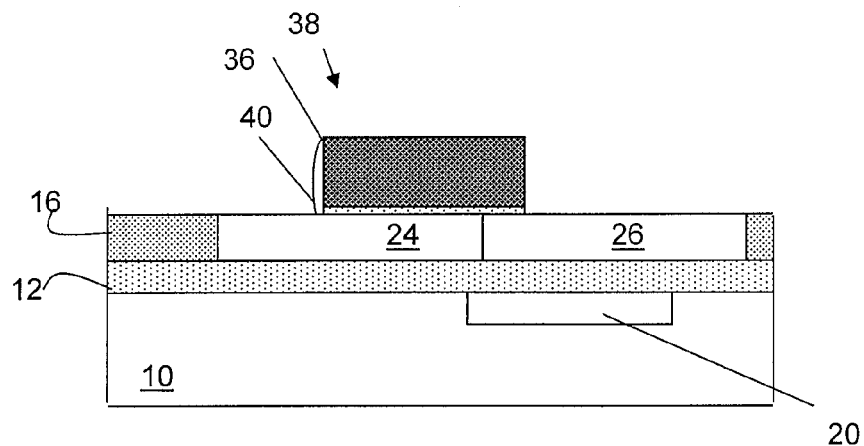

As shown in FIG. 10, the gate oxide 34 and the gate material 36 can be patterned using conventional lithographic and etching processes. For example, in embodiments, a resist is formed on the gate material 36, and exposed to energy to form a pattern (opening). In embodiments, the opening is preferably asymmetrically formed over the N-well 24 and the P-well 26 (e.g., on the N-well 24 and partly on the P-well 26). An etching process, e.g., RIE, is then performed, to form a gate structure 38. In embodiments, the gate structure 38 can include conventionally formed sidewall (spacers) 40.

Figure 11:
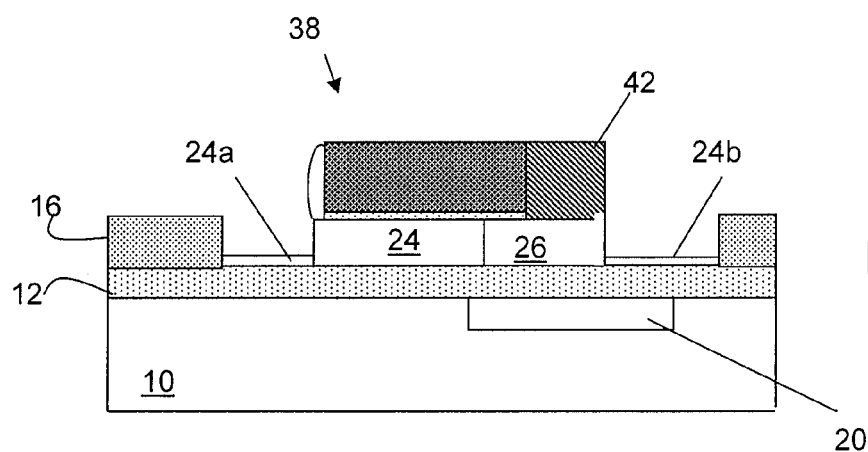

As shown in FIG. 11, after formation of the gate structure 38, a mask material, e.g., nitride 42, is formed on the structure and patterned using conventional lithography and etching processes, as described herein. In embodiments, the nitride material 42 is provided on the P-well 26. As shown in FIG. 11, the mask material, e.g., nitride 42, is removed from all other remaining surfaces.

As described above, the nitride material 42 (and gate structure 38) provides a self aligned mask for etching source and drain regions. More specifically, as shown in FIG. 11, after the etching of the nitride material 42, a second etching process is provided to form seed layers 24a and 26a, for subsequent formation of the source and drain regions. In optional embodiments, the N-seed layer 24a and the P− seed layer 26a can be doped to form P+ regions and N+ regions, respectively. In this way, additional dopants can be provided in the respective seed layers 24a and 26a, prior to formation of raised source and drain regions.

Figure 12:
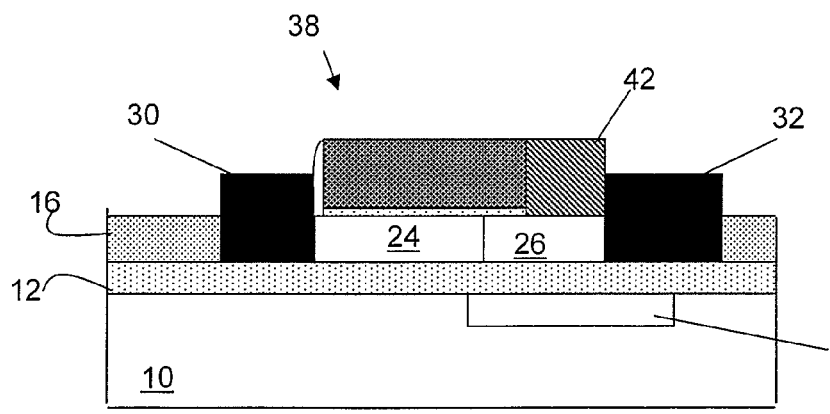

In FIG. 12, raised source and drain regions are formed on the respective seed layers 24a and 26a. More specifically, using separate masking steps, the source region 30 and drain region 32 are formed, using the seed layers 24a and 26a, respectively. Even more specifically, while masking the seed layer 26a, an epitaxial grown Si layer is provided on the seed layer 24a, to form the P+ source region 30. In embodiments, the epitaxial grown Si layer can be an in situ doped P+ material. Alternatively, the epitaxial grown Si layer can be doped after the growth process. Similarly, while masking the P+ source region 30, an epitaxial grown Si layer is provided on the seed layer 26a, to form the N+ drain region 32. In embodiments, the epitaxial grown Si layer can be an in situ doped N+ material. Alternatively, the epitaxial grown Si layer can be doped after the growth process. It should be understood by those of skill in the art that the drain and source regions can be formed in any order.

As should be thus understood, the structure of FIG. 12 forms a dual gate triggered P+/N−/P−/N+ SCR structure. In this structure, for example, the N+ region 20 (e.g., back gate) is used to turn on N− to N+ parasitic NFET to trigger the SCR during an ESD event. Also, the top gate is used to turn on the P+ to P− parasitic PFET to trigger the SCR during an ESD event.

Figure 13:
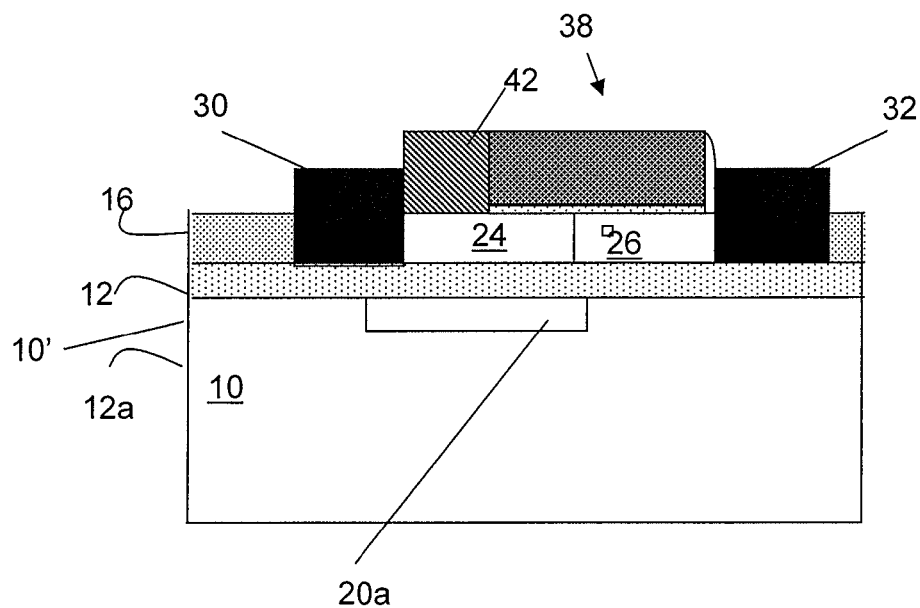
FIG. 13 shows an alternative dual gate triggered structure and respective processing steps in accordance with aspects of the present invention.

FIG. 13 shows an alternative dual gate triggered structure and respective processing steps in accordance with aspects of the present invention. In the structure of FIG. 13, the back gate is a P+ region 20a, formed in the p-substrate 10. As shown in FIG. 13, the P+ region covers the entire N-well 24, and partially covers the P+ region 30 and the P-well 26. In this way, the structure of FIG. 13 forms a PNP structure.

The processing steps to form the structure of FIG. 13 are similar to the processing steps of FIGS. 9-12, with the exception of the formation and placement of the P+ region 20a, under the BOX 12, and the formation of the gate structure 38 and nitride 42 on the other side of the structure (e.g., the gate structure 38 disposed on the P-well 26 and partly on the N-well 24). That is, the P+ region 20a will be formed by a P+ dopant type, through a pattern formed in a resist, which is aligned with the N-well 24. Also the gate structure 38 will be patterned in a mirror image of that shown in FIG. 6.

Figure 14:
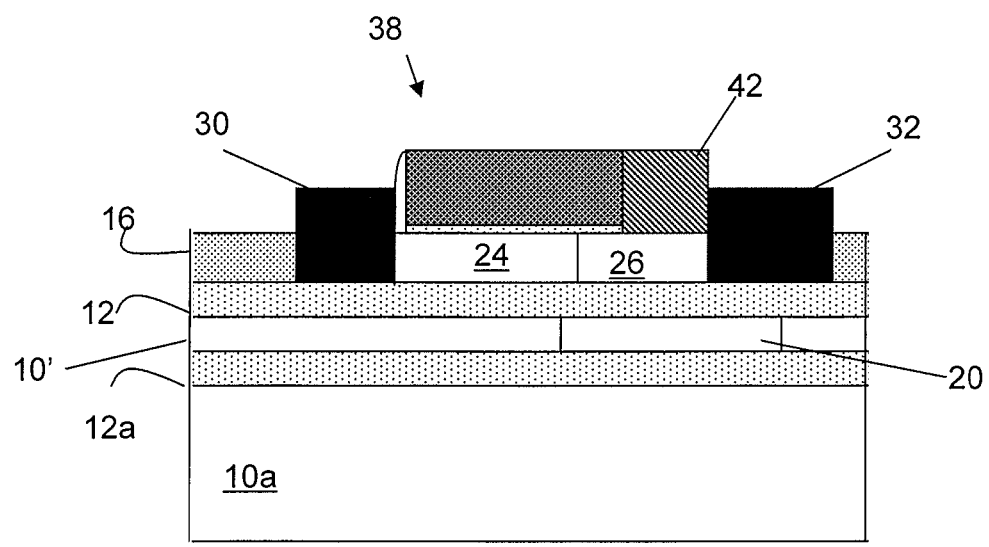
FIG. 14 show an alternative dual gate triggered structure using a double BOX structure and respective processing steps in accordance with aspects of the present invention.

FIG. 14 shows an alternative structure using a double BOX structure and respective processing steps in accordance with aspects of the present invention. More specifically, the structure of FIG. 14 comprises the structure of FIG. 9 with an additional BOX and wafer layer. In particular, after the formation of the structure of FIG. 9, the wafer 10 can be thinned by conventional mechanical grinding. The grinding will preferably stop at the N+ region 20. Thereafter, the thinned wafer 10' is bonded to a BOX 12a. As shown in FIG. 14, the BOX 12a is also formed on a wafer 10a. In embodiments, the wafer 10a can have similar material properties to the thinned wafer 10', and can be bonded to the BOX 12a using any conventional bonding technique. In an alternative manner of processing, after the thinning of the wafer 10', the N+ region 20 can be formed from an underside of the wafer.

Figure 15:
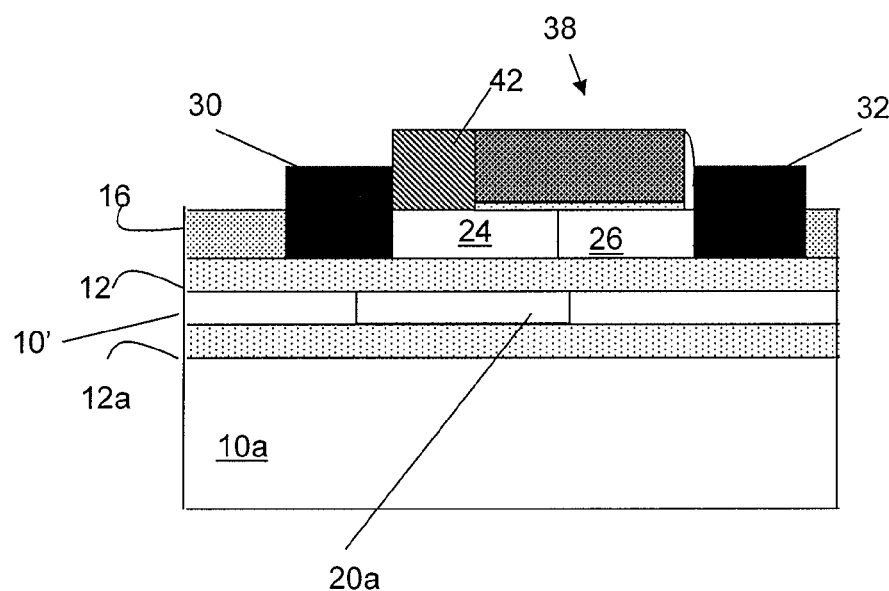
FIG. 15 show an alternative dual gate triggered structure using a double BOX structure and respective processing steps in accordance with aspects of the present invention.

FIG. 15. shows an alternative structure using a double BOX structure and respective processing steps in accordance with aspects of the present invention. More specifically, the structure of FIG. 15 comprises the structure of FIG. 13 with an additional BOX and wafer layer. In particular, after the formation of the structure of FIG. 13, the wafer 10 can be thinned by conventional mechanical grinding. The grinding will preferably stop at the P+ region 20a. Thereafter, the thinned wafer 10' is bonded to a BOX 12a. As shown in FIG. 15, the BOX 12a is also formed on a wafer 10a. In embodiments, the wafer 10a can have similar material properties to the thinned wafer 10', and can be bonded to the BOX 12a using any conventional bonding technique. In an alternative manner of processing, after the thinning of the wafer 10', the P+ region 20a can be formed from an underside of the wafer.

Figure 16:
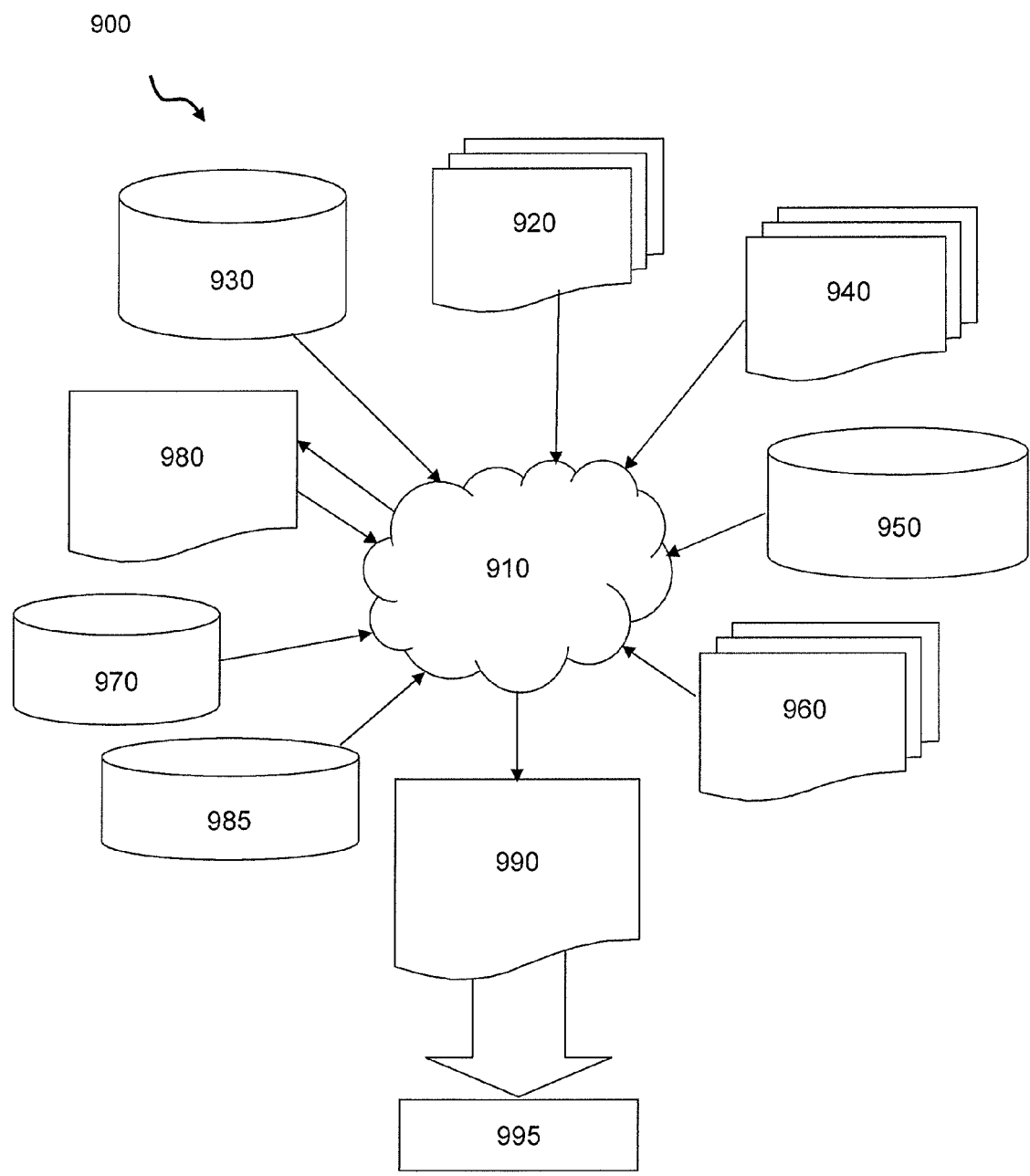
FIG. 16 is a flow diagram of a design process used in semiconductor design, manufacture, and/or test.

FIG. 16 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-15. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 16 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-15. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-15 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-15. In one embodiment, design structure 990 may comprise a compiled, executable HDL simulation model that functionally simulates the devices shown in FIGS. 1-15.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-15. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A method comprising:
  forming a first diffusion type and a second diffusion type in a semiconductor layer of a silicon on insulator (SOI) substrate, wherein the SOI substrate is an ultra thin body and box technology node;
  forming a back gate of a first diffusion type in a substrate under an insulator layer of the SOI substrate; and
  forming diffusion regions of a first dopant type and a second dopant type, adjacent to the second diffusion type and the first diffusion type, respectively,
  wherein the back gate is formed to completely cover the second diffusion type and partially cover the first diffusion type and the second dopant type of the diffusion regions, which are raised.
2. A method comprising:
  forming a first diffusion type and a second diffusion type in a semiconductor layer of a silicon on insulator (SOI) substrate;
  forming a back gate of a first diffusion type in a substrate under an insulator layer of the SOI substrate; and
  forming diffusion regions of a first dopant type and a second dopant type, adjacent to the second diffusion type and the first diffusion type, respectively,
  wherein:
    the back gate is formed to cover the second diffusion type, the first diffusion type and the second dopant type of the diffusion regions;
    forming of the diffusion regions of the first dopant type and the second dopant type are raised diffusion regions comprising:
      forming a mask over a portion of the first diffusion type and the second diffusion type in the semiconductor layer;

etching exposed regions of the first diffusion type and the second diffusion type to form respective seed layers, using the mask as self alignment; and growing epitaxial material within the etched regions.

3. The method of claim 2, wherein the epitaxial material is separately grown for each etched region, and then separately doped with respective dopant types and masked to form the raised diffusion regions of the first dopant type and the second dopant type.

4. The method of claim 2, wherein the epitaxial material is in-situ doped material separately grown for each etched region.

5. The method of claim 2, wherein the respective seed layers are doped with the first dopant type and the second dopant type, prior to the epitaxial growth.

6. A method comprising:

forming a first diffusion type and a second diffusion type in a semiconductor layer of a silicon on insulator (SOD) substrate;

forming a back gate of a first diffusion type in a substrate under an insulator layer of the SOI substrate; and forming diffusion regions of a first dopant type and a second dopant type, adjacent to the second diffusion type and the first diffusion type, respectively, wherein:

the back gate is formed to cover the second diffusion type, the first diffusion type and the second dopant type of the diffusion regions:

the first diffusion type is P−;

the second diffusion type is N−;

the first dopant type of the raised diffusion regions is P+;

the second dopant type of the raised diffusion regions is N+; and the first diffusion type of the back gate is N+, thereby forming an NPN silicon controlled rectifier (SCR).

7. The method of claim 6, further comprising:

grinding the SOI substrate; and bonding the SOI substrate to a BOX layer formed on another SOI substrate.

8. The method of claim 6, further comprising:

forming a gate structure on the first diffusion type and the second diffusion type and a masking material adjacent to the gate structure, thereby forming a dual gate triggered P+/N−/P−/N+ SCR structure.

9. The method of claim 8, further comprising:

grinding the SOI substrate; and bonding the SOI substrate to a BOX layer formed on another SOI substrate.

10. A method comprising:

forming a first diffusion type and a second diffusion type in a semiconductor layer of a silicon on insulator (SOI) substrate;

forming a back gate of a first diffusion type in a substrate under an insulator layer of the SOI substrate; and forming diffusion regions of a first dopant type and a second dopant type, adjacent to the second diffusion type and the first diffusion type, respectively, wherein:

the back gate is formed to cover the second diffusion type, the first diffusion type and the second dopant type of the diffusion regions;

the first diffusion type is N−;

the second diffusion type is P−;

the first dopant type of the diffusion regions is N+;

the second dopant type of the diffusion regions is P+; and the first diffusion type of the back gate is P+, thereby forming an PNP silicon controlled rectifier (SCR).

11. The method of claim 10, further comprising:

grinding the SOI substrate; and bonding the SOI substrate to a BOX layer formed on another SOI substrate.

12. The method of claim 10, further comprising:

forming a gate structure on the first diffusion type and the second diffusion type and a masking material adjacent to the gate structure, thereby forming a dual gate triggered N+/P−/N−/P+ SCR structure.

13. The method of claim 12, further comprising:

grinding the SOI substrate; and bonding the SOI substrate to a BOX layer formed on another SOI substrate.

* * * * *